United States Patent
Kong et al.

(10) Patent No.: US 10,914,781 B2
(45) Date of Patent: Feb. 9, 2021

(54) AGING TEST METHOD AND AGING TEST SYSTEM FOR LIGHT EMITTING DEVICE

(71) Applicant: BOE TECHNOLOGY GROUP CO., LTD., Beijing (CN)

(72) Inventors: Chao Kong, Beijing (CN); Kening Zheng, Beijing (CN); Dong Chen, Beijing (CN); Yinan Liang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 49 days.

(21) Appl. No.: 16/329,393

(22) PCT Filed: May 3, 2018

(86) PCT No.: PCT/CN2018/085434
§ 371 (c)(1),
(2) Date: Feb. 28, 2019

(87) PCT Pub. No.: WO2018/228076
PCT Pub. Date: Dec. 20, 2018

(65) Prior Publication Data
US 2019/0195938 A1    Jun. 27, 2019

(30) Foreign Application Priority Data
Jun. 16, 2017   (CN) .......................... 2017 1 0457024

(51) Int. Cl.
*G01R 31/26*   (2020.01)
*H05B 45/50*   (2020.01)
*H05B 45/00*   (2020.01)

(52) U.S. Cl.
CPC ......... *G01R 31/2642* (2013.01); *H05B 45/50* (2020.01); *H05B 45/60* (2020.01); *Y02B 20/30* (2013.01)

(58) Field of Classification Search
CPC ............ G01R 31/2642; G01R 31/2635; G01R 31/44; H05B 45/60; H05B 5/50;
(Continued)

(56) References Cited

U.S. PATENT DOCUMENTS

| | | | | |
|---|---|---|---|---|
| 2008/0224966 A1* | 9/2008 | Cok | .................. | G09G 3/32 345/82 |
| 2008/0252571 A1* | 10/2008 | Hente | .................. | H05B 45/60 345/76 |
| 2014/0138658 A1 | 5/2014 | Aonuma | | |

FOREIGN PATENT DOCUMENTS

| CN | 101278327 A | 10/2008 |
|---|---|---|
| CN | 101355834 A | 1/2009 |

(Continued)

OTHER PUBLICATIONS

The First Office Action dated Mar. 19, 2018 corresponding to Chinese application No. 201710457024.3.
(Continued)

*Primary Examiner* — Son T Le
*Assistant Examiner* — Dustin R Dickinson
(74) *Attorney, Agent, or Firm* — Nath, Goldberg & Meyer; Joshua B. Goldberg (57) ABSTRACT

An aging test method for a light emitting device is provided. The aging test method includes: collecting, in an aging process applied to the light emitting device, an initial value of a first characteristic parameter of the light emitting device and an initial test time point; collecting a current value of the first characteristic parameter and a current test time point (step S1); generating a feature line according to the initial value, the current value, the initial test time point, and the current test time point, and calculating a slope of the feature line; determining whether the slope of the feature line is greater than or equal to a predetermined threshold and less than 0, and returning to the step S1 if a result of the
(Continued)

determination is NO; and terminating the aging process applied to the light emitting device if the result of the determination is YES.

20 Claims, 5 Drawing Sheets

(58) Field of Classification Search
CPC ............ H05B 45/58; G09G 2320/043; G09G 2320/045; G09G 3/006; Y02B 20/343; H01L 51/56
See application file for complete search history.

(56) References Cited

FOREIGN PATENT DOCUMENTS

| CN | 107018603 A | 8/2017 |
|---|---|---|
| TW | 527850 B | 4/2003 |

OTHER PUBLICATIONS

The Second Office Action dated Oct. 26, 2018 corresponding to Chinese application No. 201710457024.3.
The International Search Report dated Jul. 24, 2018 corresponding to application No. PCT/CN2018/085434.

\* cited by examiner

AGING TEST METHOD AND AGING TEST SYSTEM FOR LIGHT EMITTING DEVICE

CROSS-REFERENCE TO RELATED APPLICATIONS

This is a National Phase Application filed under 35 U.S.C. 371 as a national stage of PCT/CN2018/085434, filed May 3, 2018, an application claiming the benefit of Chinese Patent Application No. 201710457024.3 filed on Jun. 16, 2017, the contents of which are incorporated herein in their entirety by reference.

TECHNICAL FIELD

The present disclosure relates to the field of display technology, and in particular to an aging testing method and an aging test system for a light emitting device.

BACKGROUND

With development of organic semiconductor technology, technology of organic light emitting diodes (OLEDs) has become more mature, and OLEDs are playing an increasingly important role in lighting and display fields. Different from traditional liquid crystal displays, OLEDs are ultra thin and have the advantages of self-luminescence, wide viewing angle, fast response, high luminous efficiency, low power consumption and wide operating temperature range, and thus have been considered more promising. Meanwhile, there has been significant progress in researches on organic lighting.

SUMMARY

The present disclosure provides an aging test method and an aging test system for a light emitting device.

Some embodiments of the present disclosure provide an aging test method for a light emitting device, including: a step S0 of collecting, in an aging process applied to the light emitting device, an initial value of a first characteristic parameter of the light emitting device and an initial test time point corresponding to the initial value; a step S1 of collecting a current value of the first characteristic parameter and a test time point corresponding to the current value, wherein the test time point corresponding to the current value is different from the initial test time point; a step S2 of generating a feature line according to the initial value, the current value, the initial test time point, and the test time point corresponding to the current value, and calculating a slope of the feature line; a step S3 of determining whether the slope of the feature line is greater than or equal to a predetermined threshold and less than 0, and returning to the step S1 if it is determined that the slope of the feature line is less than the predetermined threshold; a step S4 of replacing the initial value with the current value, replacing the initial test time point with the test time point corresponding to the current value, and returning to the step S1, if it is determined that the slope of the feature line is greater than or equal to 0; and a step S5 of terminating, if it is determined that the slope of the feature line is greater than or equal to the predetermined threshold and less than 0, the aging process applied to the light emitting device.

In an embodiment, the step S2 includes: a step S21 of calculating a ratio of the current value to the initial value of the first characteristic parameter, defining the ratio as a current value of a second characteristic parameter, and setting an initial value of the second characteristic parameter to 1; and a step S22 of generating the feature line according to the current value and the initial value of the second characteristic parameter, the initial test time point, and the test time point corresponding to the current value.

In an embodiment, the first characteristic parameter is brightness of the light emitting device, and the initial value is an initial brightness value of the light emitting device.

In an embodiment, after the step S5, the aging test method further includes: a step S6 of recording at least one of: duration of the aging process and an aging amount of the light emitting device.

In an embodiment, the feature line is a curve or a straight line.

In an embodiment, the aging test method further includes a step of: storing respective values of the first characteristic parameter, test time points corresponding to the respective values, and the predetermined threshold in a memory.

In an embodiment, the aging test method further includes a step of: setting a test mode of the aging test method before performing the step S0.

In an embodiment, the test mode includes one of: a constant-current mode, a constant-voltage mode and a constant-brightness mode.

In an embodiment, a current density of the light emitting device is set to 10 $mA/cm^2$ in the constant-current mode.

Some embodiments of the present disclosure provide an aging test system for a light emitting device, including: a collection unit configured to collect, in an aging process applied to the light emitting device, an initial value of a first characteristic parameter of the light emitting device and an initial test time point corresponding to the initial value, and collect a current value of the first characteristic parameter and a test time point corresponding to the current value, wherein the test time point corresponding to the current value is different from the initial test time point; a generation unit configured to generate a feature line according to the initial value, the current value, the initial test time point and the test time point corresponding to the current value, and calculate a slope of the feature line; a determining unit configured to determine whether the slope of the feature line is greater than or equal to a predetermined threshold and less than 0, and trigger, when it is determined that the slope of the feature line is less than the predetermined threshold, the collection unit to continue to collect the current value of the first characteristic parameter and the test time point corresponding to the current value; a setting unit configured to replace, when it is determined by the determining unit that the slope of the feature line greater than or equal to 0, the initial value with the current value, replace the initial test time point with the test time point corresponding to the current value, and trigger the collection unit to continue to collect the current value of the first characteristic parameter and the test time point corresponding to the current value; and an aging controller configured to terminate the aging process applied to the light emitting device when it is determined by the determining unit that the slope of the feature line is greater than or equal to the predetermined threshold and less than 0.

In an embodiment, the generation unit includes: a calculation subunit configured to calculate a ratio of the current value to the initial value of the first characteristic parameter, define the ratio as a current value of a second characteristic parameter, and set an initial value of the second characteristic parameter to 1; and a generation subunit configured to generate the feature line according to the current value and the initial value of the second characteristic parameter, the initial test time point and the test time point corresponding to the current value.

In an embodiment, the first characteristic parameter is brightness of the light emitting device, and the initial value is an initial brightness value of the light emitting device.

In an embodiment, the aging controller is further configured to record at least one of: duration of the aging process and an aging amount of the light emitting device after terminating the aging process applied to the light emitting device.

In an embodiment, the setting unit is further configured to set a test ode for the aging test system before the collection unit begins to collect values of the first characteristic parameter.

In an embodiment, the test mode includes one of: a constant-current mode, a constant-voltage mode and a constant-brightness mode.

In an embodiment, a current density of the light emitting device is set to 10 $mA/cm^2$ in the constant-current mode.

In an embodiment, the aging test system further includes a memory configured to store respective values of the first characteristic parameter, test time points corresponding to the respective values, and the predetermined threshold.

Some embodiments of the present disclosure provide a computer readable storage medium storing thereon with computer readable instructions, which cause implementation of the aging test method provided by the present disclosure by a CPU when the computer readable instructions are executed by the CPU.

DETAILED DESCRIPTION

In order to enable those skilled in the art to better understand the technical solutions of the present disclosure, the aging test method and aging test system for a light emitting device provided by embodiments of the present disclosure will be further described in detail below with reference to the accompanying drawings.

Luminescent lifetime (i.e., product lifetime) is an important index for evaluating an OLED. Currently, in addition to improvements in materials and fabrication processes, stable device performance is also an indispensable factor desired for OLEDs. There are various factors that affect product lifetimes of OLEDs in mass production thereof and there is a large difference in product lifetimes between different batches of OLEDs, which makes it difficult to control aging of OLED in a later stage. Inappropriate aging process applied to OLEDs will cause a large difference in product lifetimes of the OLEDs that have leaved a factory, affecting clients' use. As such, though having the same structure, OLEDs in different batches differ significantly in lifetimes. Therefore, OLEDs are aged before leaving the factory, so as to guarantee uniformity and stability of product lifetimes of the OLEDs that leave the factory.

Control of aging amount of an OLED in an aging process is generally carried out by controlling duration of the aging process or attenuation of a parameter value of the OLED. However, neither of the above two solutions may achieve good control of uniformity of product lifetimes of OLEDs. For example, if the aging amount of an OLED in an aging process is controlled by controlling duration of the aging process, different OLEDs vary greatly in product lifetimes after being aged for a same duration (e.g. half an hour). Therefore, it is possible that uniformity of lifetimes of OLEDs is not guaranteed by using the above two solutions to age the OLEDs.

Figure 1:
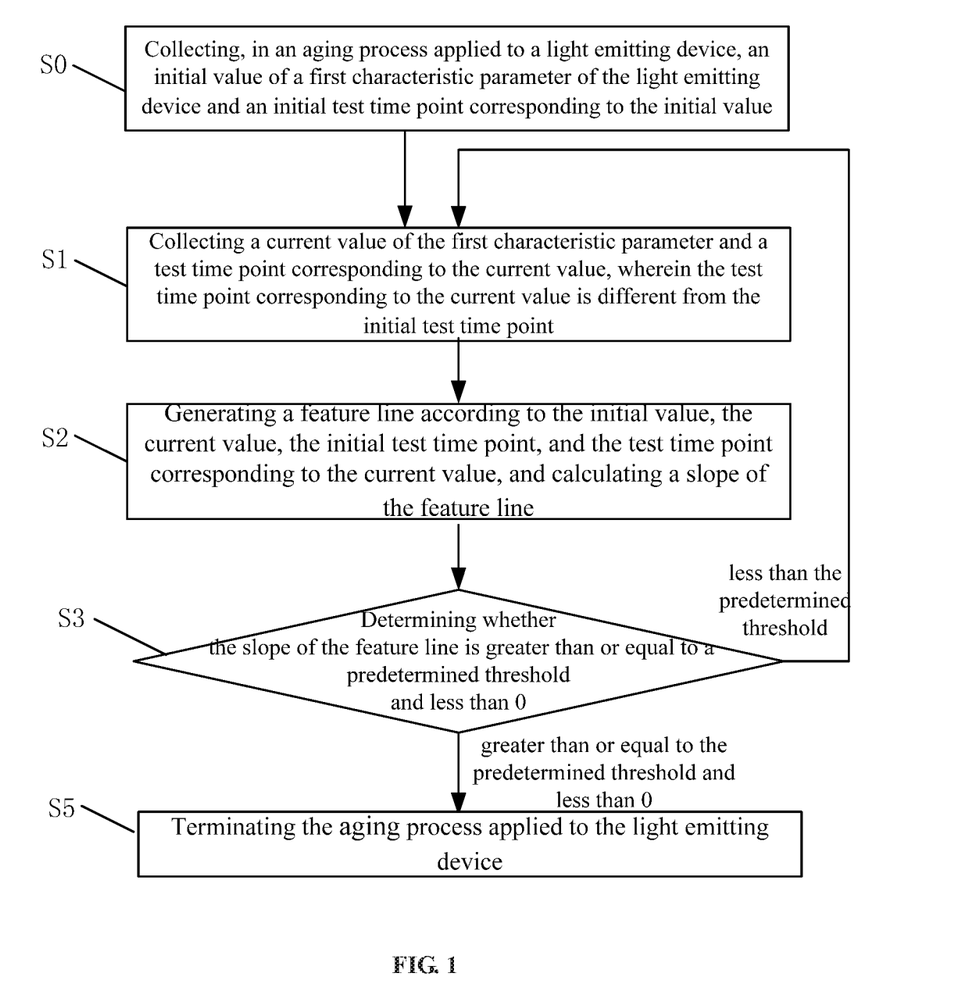
FIG. 1 is a flowchart illustrating an aging test method for a light emitting device provided by an embodiment of the present disclosure.

FIG. 1 is a flowchart illustrating an aging test method for a light emitting device provided by an embodiment of the present disclosure. As shown in FIG. 1, the aging test method may include the following steps S0, S1, S2, S3 and S5.

At step S0, in an aging process applied to a light emitting device, an initial value of a first characteristic parameter of the light emitting device and an initial test time point corresponding to the initial value is collected. For example, the first characteristic parameter may be brightness of the light emitting device, and the initial value may be a first measured value of brightness of the light emitting device.

At step S1, a current value of the first characteristic parameter and a test time point corresponding to the current value is collected, wherein the test time point corresponding to the current value is different from the initial test time point. Alternatively, in the aging process applied to the light emitting device, a plurality of values of the first characteristic parameter of the light emitting device and test time points corresponding to the plurality of values may be collected at different time points respectively, and stored in a memory for subsequent processing. For example, in subsequent processing, two adjacent values and corresponding test time points are taken from the memory at a time in chronological order, to perform the following steps S2, S3 and S5.

The aging test method for a light emitting device in the embodiment may be carried out in an aging process applied to a light emitting device. For example, the light emitting device may be an OLED, but the present disclosure is not limited thereto.

Each step in the embodiment may be manually performed or performed by an aging test system for a light emitting device to be described below. In a case where each step in the embodiment is performed by the aging test system for a light emitting device, the aging test system for a light emitting device may be supplied with working power before performing the step S1 so as to be preheated.

In the embodiment, a test mode may be set before performing the step S0. For example, the test mode may be a constant-current mode, a constant-voltage mode or a constant-brightness mode. In the embodiment, the test mode is the constant-current mode. For example, a current density of all light emitting devices may be set to 10 mA/cm². In the embodiment, when the test mode is set, in a process of testing the light emitting devices, all the light emitting devices emit light in the set test mode, and each light emitting device may emit light in the set test mode in an aging test process. For example, when the constant-current mode is adopted as the test mode, all the light emitting devices emit light in the constant-current mode. That is, current of all the light emitting devices is constant, and current of each light emitting device may be constant in an aging test process.

In the embodiment, a plurality of values of the first characteristic parameter of the light emitting device may be collected at a predetermined interval, and a test time point at which each of the plurality of values of the first characteristic parameter is collected may be recorded. In other words, an interval between two adjacent test time points is the predetermined interval. In the aging process, a number of the collected values of the first characteristic parameter may be at least one, such as two, ten, forty or sixty. However, the present disclosure is not limited thereto, and the number of the collected values of the first characteristic parameter may be configured as required.

In the embodiment, the first characteristic parameter may be brightness as mentioned above. However, the present disclosure is not limited thereto, and the first characteristic parameter may be any measurable parameter of the light emitting device which degrades over time.

At step S2, a feature line is generated according to the initial value, the current value, the initial test time point, and the test time point corresponding to the current value, and a slope of the feature line is calculated. For example, in a two-dimensional coordinate system in which a horizontal axis represents test time and a vertical axis represents measured values, a point formed according to the initial value and the initial test time point is connected with a point formed according to the current value and the test time point corresponding to the current value, to obtain a feature line, and a slope of the feature line may be calculated.

Specifically, the step S2 may include the following steps S21 and S22.

At step S21, a ratio of the current value to the initial value of the first characteristic parameter is calculated, the ratio is defined as a current value of a second characteristic parameter, and an initial value of the second characteristic parameter is set to 1.

In the embodiment, since there are a plurality of values of the first characteristic parameter which are collected in chronological order, a plurality of values of the second characteristic parameter will be calculated. In other words, a plurality of values of the second characteristic parameter may be calculated according to the plurality of values and the initial value of the first characteristic parameter, and a number of the plurality of values of the second characteristic parameter may be equal to that of the plurality of values of the first characteristic parameter.

In the embodiment, the first characteristic parameter may be brightness L, and the initial value of the first characteristic parameter may be an initial brightness value L0. In this case, the second characteristic parameter may be L/L0 or L/L0×100%, and the initial value of the second characteristic parameter is set to 1 (i.e., 100%).

In the embodiment, the plurality of values of the first characteristic parameter may be collected in chronological order, wherein a first value of the first characteristic parameter collected in the step S0 may be temporarily set as the initial value, that is, the initial value is temporarily equal to a first measured value of the first characteristic parameter. In a case where the first characteristic parameter is brightness, the initial brightness value L0 is temporarily equal to the first measured value of the brightness L, and a first measured value (i.e., the initial value) of the second characteristic parameter may be set to 100% (i.e. 1) correspondingly.

At step S22, a feature line is generated according to the current value and the initial value of the second characteristic parameter, the initial test time point, and the test time point corresponding to the current value.

It should be noted that each measured value of the first characteristic parameter corresponds to a test time point at which the value of the first characteristic parameter is collected. The second characteristic parameter is calculated according to the first characteristic parameter, so that a test time point corresponding to each measured value of the second characteristic parameter is the test time point corresponding to each measured value of the first characteristic parameter.

In the step S2, a feature line is drawn in a two-dimensional coordinate system where the vertical axis represents the second characteristic parameter and the horizontal axis represents a test time point corresponding to each measured value of the second characteristic parameter, and a slope of the feature line is calculated. In other words, the vertical axis of the feature line represents the second characteristic parameter, and the horizontal axis of the feature line represents the test time corresponding to the measured values of the second characteristic parameter.

In the embodiment, the feature line may be a curve or a straight line. For example, if two values of the first characteristic parameter are collected in the aging process applied to the light emitting device, then two values of the second characteristic parameter will be calculated, in which case the feature line may be a straight line. If more than two (such as sixty) values of the first characteristic parameter are collected in the aging process applied to the light emitting device, then more than two (such as sixty) values of the second characteristic parameter will be calculated, in which case the feature line may be a straight line or a curve.

In the embodiment, the feature line represents the lifetime of the light emitting device.

At step S3, whether the slope of the feature line is greater than or equal to a predetermined threshold and less than 0 is determined, and the method is returned to the step S1 to performing the step 1 again if it is determined that the slope of the feature line is less than the predetermined threshold.

As mentioned above, in the step S3, the feature line may be generated according to the initial value and the current value of the second characteristic parameter, the initial test time point, and the test time point corresponding to the current value. The feature line is a straight line, thus the slope of the feature line may be calculated according to abscissas and ordinate values of points on the straight line.

Alternatively, in the step S3, the feature line may be a curve if more than two measured values are collected in chronological order. In this case, two adjacent points on the curve may be taken in turn in chronological order to form a line, so as to convert the curve into a straight line, and calculate the slope of the feature line according to abscissas and ordinate values of points on the straight line. It should be noted that slopes of different positions of the feature line may be different in a case where the feature line is a curve.

In the embodiment, the predetermined threshold is less than 0, for example, the predetermined threshold may be −0.05.

At step S5, if it is determined that the slope of the feature line is greater than or equal to the predetermined threshold and less than 0, the aging process applied to the light emitting device is terminated.

In the step S5, aging equipment may be controlled to terminate the aging process applied to the light emitting device.

In an embodiment, after the step S5, the aging test method may further include a step S6, in which at least one of duration of the aging process and an aging amount of the light emitting device is recorded.

In an embodiment, the duration of the aging process may be a period of time from the beginning of the aging process to the end of the aging process. The aging amount may be the aging amount of the light emitting device caused by aging the light emitting device for the period of time from the beginning of the aging process to the end of the aging process. For example, the aging amount may be an absolute value of a difference between a value of the second characteristic parameter corresponding to a time point of the beginning of the aging process and a value of the second characteristic parameter corresponding to a time point of the end of the aging process. Alternatively, the aging amount may be an absolute value of a difference between a value of the first characteristic parameter corresponding to a time point of the beginning of the aging process and a value of the first characteristic parameter corresponding to a time point of the end of the aging process.

In practical production, after all the light emitting devices that require an aging process have been aged with the method provided by the embodiment, lifetime tests may be performed on different aged light emitting devices. For example, the light emitting devices in different batches may be sampled and tested. By comparison between FIG. 2 and FIG. 3, effects of the aging test method for a light emitting device according to the embodiment will be described in detail below.

Figure 2:
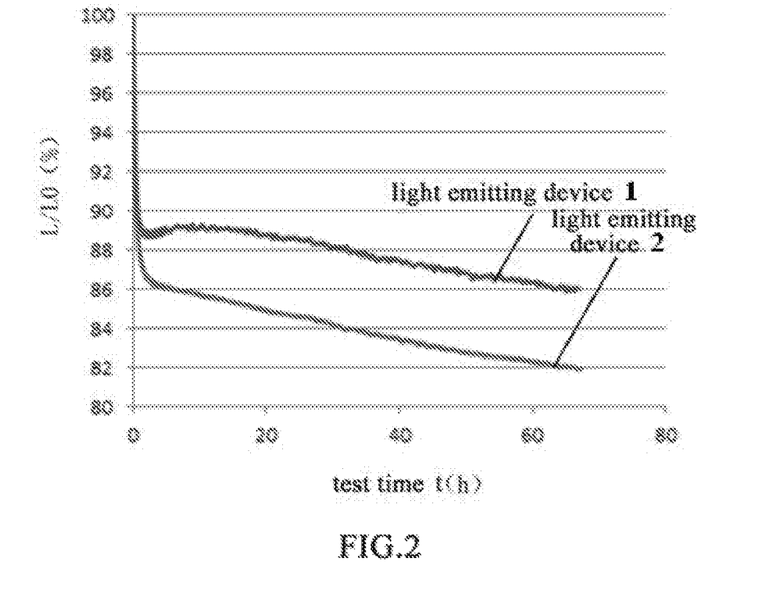
FIG. 2 is a lifetime curve of light emitting devices when the light emitting devices are not aged with the aging test method provided by the embodiment of the present disclosure.

FIG. 2 is a lifetime curve of light emitting devices when the light emitting devices are not aged with the aging test method according to the embodiment corresponding to FIG. 1. As shown in FIG. 2, there is a large difference between a lifetime curve of light emitting device 1 and that of light emitting device 2, that is, there is a large difference between the lifetime curves of two different light emitting devices. Therefore, there is poor uniformity of lifetimes of different light emitting devices.

Figure 3:
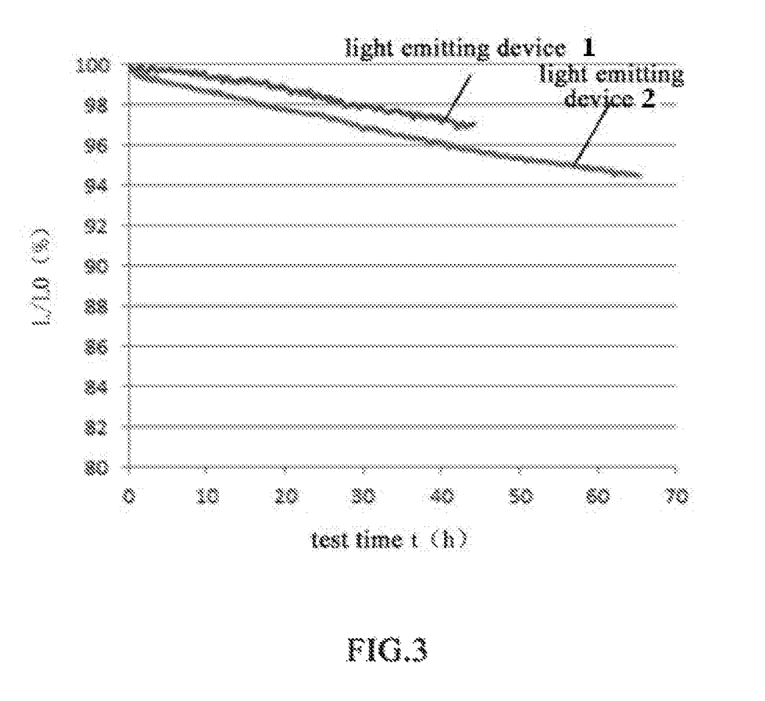
FIG. 3 is a lifetime curve of light emitting devices when the light emitting devices are aged with the aging test method provided by the embodiment of the present disclosure.

FIG. 3 is a lifetime curve of light emitting devices when the light emitting devices are aged with the aging test method according to the embodiment corresponding to FIG. 1. In other words, FIG. 3 shows lifetime curves drawn according to lifetime tests of the light emitting devices after the light emitting devices are aged. It can be seen from FIG. 3 that a lifetime curve of light emitting device 1 is very close to that of light emitting device 2, that is, the lifetime curves of two different light emitting devices are very close to each other and there is no big difference therebetween. Therefore, there is good uniformity of lifetimes of different light emitting devices.

In the technical solution of the aging test method for a light emitting device provided by the embodiment, in the aging process applied to the light emitting device, the feature line is generated according to the collected values of the first characteristic parameter and time points corresponding to respective measured values of the first characteristic parameter. When it is determined that the slope of the feature line is greater than or equal to the predetermined threshold and less than 0, the aging process applied to the light emitting device is terminated. In the embodiment, corresponding aging processes are performed on different light emitting devices, so as to reduce differences between lifetimes of different light emitting devices, thereby improving uniformity of lifetimes of light emitting devices.

Figure 4:
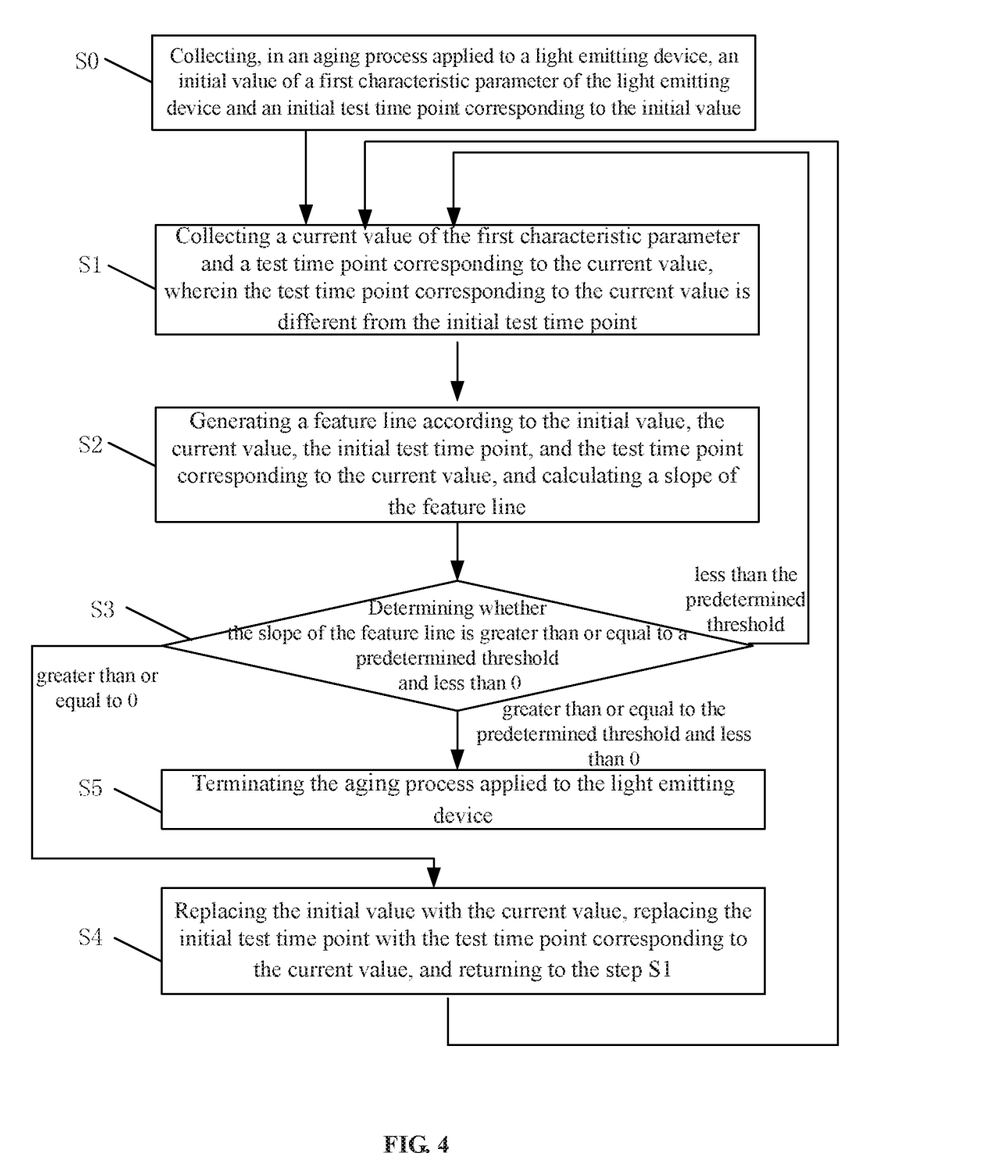
FIG. 4 is a flowchart illustrating an aging test method for a light emitting device provided by an embodiment of the present disclosure.

FIG. 4 is a flowchart illustrating an aging test method for a light emitting device provided by an embodiment of the present disclosure. As shown in FIG. 4, the aging test method may include the following steps S0 to S5.

It should be noted that the aging test method provided by the embodiment corresponding to FIG. 4 and that provided by the embodiment corresponding to FIG. 1 differ in the step S4. In other words, the steps S0, S1, S2, S3 and S5 of the aging test method provided by the embodiment corresponding to FIG. 4 may be same as the steps S0, S1, S2, S3 and S5 of the aging test method provided by the embodiment corresponding to FIG. 1, and reference may be made to the above contents and FIG. 1 for detailed description. Therefore, the step S4 will be mainly described below.

Figure 5:
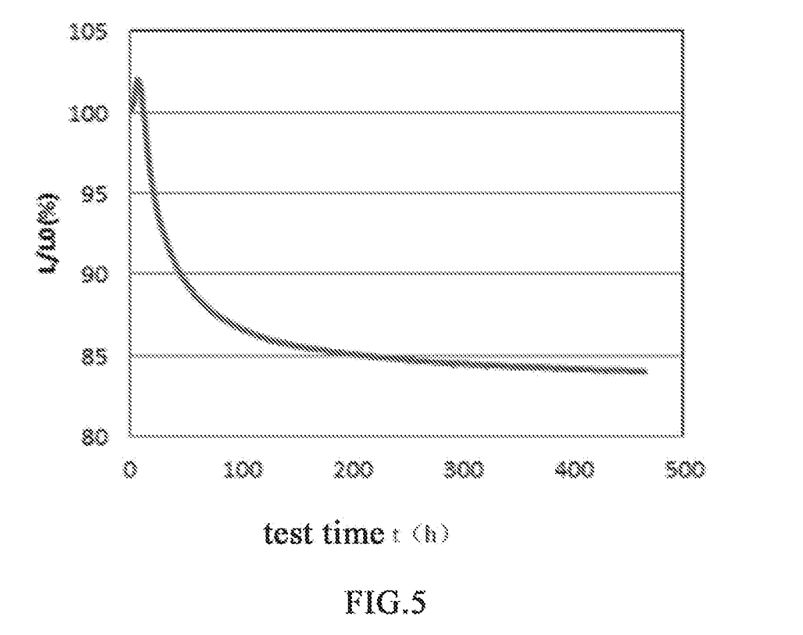
FIG. 5 is a lifetime curve of a light emitting device when the light emitting device is not aged with the aging test method provided by an embodiment of the present disclosure.

As shown in FIG. 4, in the above step S3, if it is determined that the slope of the feature line is greater than or equal to 0, the feature line may be abnormal, which is caused by abnormality of the light emitting device itself. FIG. 5 is a lifetime curve of a light emitting device when the light emitting device is not aged with the aging test method according to the embodiment corresponding to FIG. 4. As shown in FIG. 5, the curve rises in an initial stage and reaches a peak greater than 100%, and then begins to decline. For example, the rise of the curve may be corresponding to a case where the slope of the feature line is greater than 0, which means that the feature line is of abnormal. That is, the rise of the curve shown in FIG. 5 would happen if the light emitting device is subject to a lifetime test without being aged in advance. The case indicates abnormality of the light emitting device itself.

At step S4, if it is determined that the slope of the feature line is greater than or equal to 0, the initial value of the step S0 is replaced with the current value of the step S1, and the method is returned to the step S1 to continue to perform the step S1.

The step S4 may be performed in a case where the feature line is abnormal (i.e., the slope of the feature line is greater than or equal to 0). In the step 4, the initial value collected in the step S0 may be replaced with the current value of the first characteristic parameter which is collected in the step S1 when the abnormality of the light emitting device happens (i.e., the rise of the curve shown in FIG. 5). Then, the method continues to test the light emitting device, that is, continues to perform the step S1, After setting the initial value, the method continues to collect a current value of the first characteristic parameter. Since the set initial value is a maximum value of the first characteristic parameter corresponding to the case where the slope of the feature line is greater than or equal to 0 (i.e., the rise of the curve shown in FIG. 5), the aging process applied to the light emitting device may be terminated if the feature line declines from the initial value and if it is determined in the step S3 that the slope of the feature line is greater than or equal to the predetermined threshold and less than 0. However, if the feature line still rises from the initial value, which indicates that the feature line is still abnormal, the step S4 would be performed again.

Figure 6:
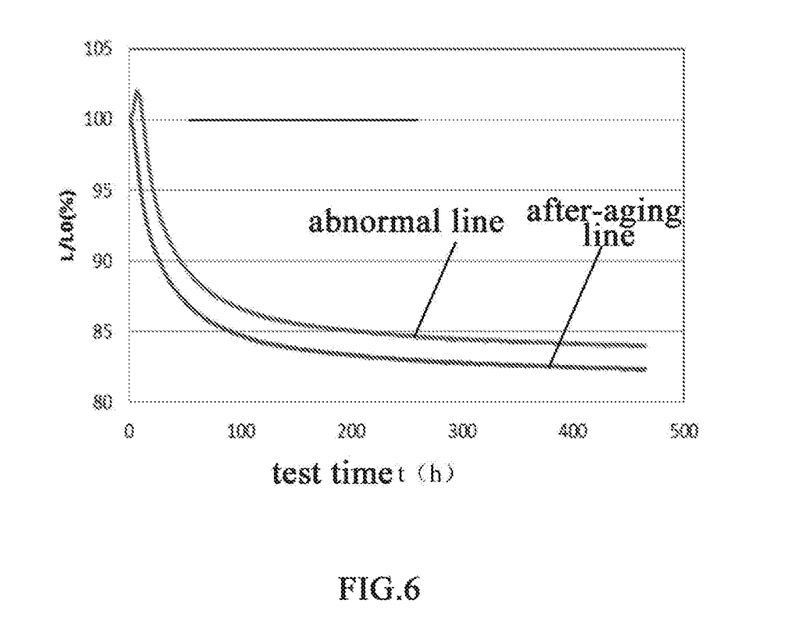
FIG. 6 is a diagram illustrating comparison between lifetime curves of a light emitting device obtained when the light emitting device is aged with and is not aged with the aging test method according to the embodiment corresponding to FIG. 4.

FIG. 6 is a diagram illustrating comparison between lifetime curves of a light emitting device obtained when the light emitting device is aged with and is not aged with the aging test method according to the embodiment corresponding to FIG. 4. Two curves are shown in FIG. 6: one curve is an abnormal curve whose detailed description may be found by referring to FIG. 5 and corresponding description, and the other curve is an after-aging curve, that is, a lifetime curve obtained after the light emitting device is subjected to an aging test through the aging test method according to the embodiment corresponding to FIG. 4 and then subjected to a lifetime test after the aging process is terminated. In other words, the other curve in FIG. 6 is a lifetime curve obtained by performing lifetime test on the light emitting device subjected to the aging test. It can be seen from FIG. 6 that the after-aging curve does not rise in the initial stage in comparison with the abnormal curve, so that the problem that the feature line being abnormal is solved and a normal lifetime curve is obtained.

It should be noted that, in a case where the feature line being abnormal, when at least one of the duration of the aging process and the aging amount of the light emitting device is recorded (the above step S6), the time point of the beginning of the aging process refers to a time point since when the feature line begins to decline after performing the method of the embodiment, that is, the time point since when the feature line becomes normal, such as a start time point of the after-aging curve shown in FIG. 6.

In the technical solution of the aging test method for a light emitting device provided by the embodiment, in the aging process applied to the light emitting device, the feature line is generated according to the collected values of the first characteristic parameter and time points corresponding to respective measured values of the first characteristic parameter. When it is determined that the slope of the feature line is greater than or equal to the predetermined threshold and less than 0, the aging process applied to the light emitting device is terminated. In the embodiment, corresponding aging processes are performed on different light emitting devices, so as to reduce differences between lifetimes of different light emitting devices, thereby improving uniformity of lifetimes of light emitting devices.

Figure 7:
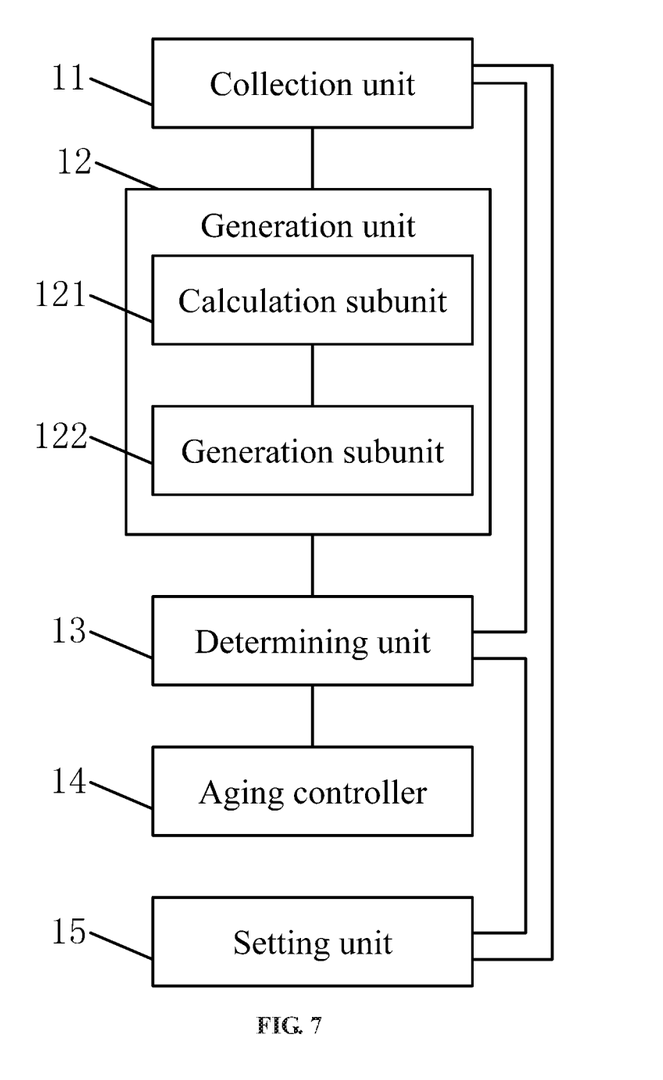
FIG. 7 is a schematic structural diagram of an aging test system for a light emitting device provided by an embodiment of the present disclosure.

FIG. 7 is a schematic structural diagram of an aging test system for a light emitting device provided by yet another embodiment of the present disclosure. As shown in FIG. 7, the aging test system may include a collection unit 11, a generation unit 12, a determining unit 13 and an aging controller 14.

The collection unit 11 is configured to collect, in an aging process applied to the light emitting device, an initial value of a first characteristic parameter of the light emitting device and an initial test time point corresponding to the initial value, and is further configured to collect a current value of the first characteristic parameter and a test time point corresponding to the current value. The test time point corresponding to the current value is different from the initial test time point. The collection unit 11 may be a brightness meter in a case where the first characteristic parameter is brightness. However, the present disclosure is not limited thereto, and the collection unit 11 may be an apparatus corresponding to a specific type of the first characteristic parameter.

The generation unit 12 is configured to generate a feature line according to the initial value, the current value, the initial test time point and the test time point corresponding to the current value, and calculate a slope of the feature line. In an embodiment, the generation unit 12 may be a calculator, a microprocessor, a central processing unit (CPU), a computer or the like.

The determining unit 13 is configured to determine whether the slope of the feature line is greater than or equal to a predetermined threshold and less than 0. When it is determined that the slope of the feature line is less than the predetermined threshold, the determining unit 13 triggers the collection unit 11 to continue to collect a current value of the first characteristic parameter and a test time point corresponding to the current value, in an embodiment, the determining unit 13 may be a comparator, a calculator, a CPU, a computer or the like.

The aging controller 14 is configured to terminate the aging process applied to the light emitting device when it is determined by the determining unit 13 that the slope of the feature line is greater than or equal to the predetermined threshold and less than 0. For example, the aging controller 14 may control an aging equipment to terminate the aging process applied to the light emitting device. Moreover, the aging controller 14 is further configured to record at least one of the duration of the aging process and the aging amount of the light emitting device after the aging process applied to the light emitting device is terminated. In an embodiment, the aging controller 14 may be a controller, a CPU, a computer or the like.

Additionally, the aging test system may further include a setting unit 15, which is configured to replace, when it is determined by the determining unit 13 that the slope of the feature line is greater than or equal to 0, the initial value with the current value, replace the initial test time point with the test time point corresponding to the current value, and trigger the collection unit 11 to continue to collect the current value of the first characteristic parameter and the test time point corresponding to the current value. In an embodiment, the setting unit 15 may be a controller, a CPU, a computer or the like.

The setting unit 15 is further configured to set a test mode for the aging test system before the collection unit 11 begins to collect values of the first characteristic parameter. The test mode may include: a constant-current mode, a constant-voltage mode and a constant-brightness mode. In the constant-current mode, a current density of the light emitting device may be set to 10 m A/cm$^2$.

In an embodiment, the generation unit 22 may include a calculation subunit 121 and a generation subunit 122. The calculation subunit 121 is configured to calculate a ratio of the current value to the initial value of the first characteristic parameter, define the ratio as a current value of a second characteristic parameter, and set an initial value of the second characteristic parameter to 1. The generation subunit 122 is configured to generate a feature line according to the current value and the initial value of the second characteristic parameter, the initial test time point and the test time point corresponding to the current value. In an embodiment, the generation subunit 122 may be a CPU or the like, and the calculation subunit 121 may be an arithmetic logic unit (ALU) of a CPU or the like.

Moreover, the aging test system may further include a memory which may be connected to one or more of the components shown in FIG. 7, The memory may be configured to store respective values of the first characteristic parameter, test time points corresponding to the respective values, and the predetermined threshold, and further configured to store respective values of the second characteristic parameter, various software or programs of the aging test system, and other data.

The above illustrates hardware implementation of each component shown in FIG. 7. Alternatively, each component shown in FIG. 7 may be an integrated circuit (IC) with corresponding functions provided by the present disclosure. Alternatively, each component shown in FIG. 7 may be implemented through combination of software and hardware. For example, in an embodiment, software capable of performing the functions provided by the present disclosure may be installed in a general computer, and when the software is executed by a CPU of the general computer, the aging test system and the aging test method provided by the present disclosure can be implemented.

In the embodiment, the initial value of the first characteristic parameter may be initially equal to a first measured value of the first characteristic parameter, which is similar to the aforesaid embodiment. As shown in FIG. 5, when the feature line rises, the initial value will be replaced with a current measured value of the first characteristic parameter, and then a new measured value of the first characteristic parameter will be collected.

In the embodiment, the first characteristic parameter may be brightness, and the initial value of the first characteristic parameter may be an initial brightness value.

In the embodiment, the feature line may be a curve or a straight line.

The aging test system provided by the embodiment may be used for performing the aging test method for a light emitting device provided by the embodiment corresponding to FIG. 1 or FIG. 4.

In the technical solution of the aging test system for a light emitting device provided by the embodiment, in the aging process applied to the light emitting device, the feature line is generated according to the collected values of the first characteristic parameter and a time point corresponding to each measured value of the first characteristic parameter. When it is determined that the slope of the feature line is greater than or equal to the predetermined threshold and less than 0, the aging process applied to the light emitting device is terminated. In the embodiment, corresponding aging processes are performed on different light emitting devices, so as to reduce differences between lifetimes of different light emitting devices, thereby improving uniformity of lifetimes of light emitting devices.

Some embodiments of the present disclosure provide a computer readable storage medium storing thereon with computer readable instructions, which cause implementation of the aging test method provided by the disclosure by a CPU when the computer readable instructions are executed by the CPU.

The embodiments of the present disclosure may be combined with each other without conflicts.

It should be understood that the foregoing implementations are merely exemplary implementations used for describing the principle of the present disclosure, but the present disclosure is not limited thereto. Those of ordinary skill in the art may make various variations and improvements without departing from the spirit and essence of the present disclosure, and these variations and improvements shall be considered as falling within the protection scope of the present disclosure.

What is claimed is:

1. An aging test method for a light emitting device, comprising:

a step S0 of collecting, in an aging process applied to the light emitting device, an initial value of a first characteristic parameter of the light emitting device and an initial test time point corresponding to the initial value;

a step S1 of collecting a current value of the first characteristic parameter and a test time point corresponding to the current value, wherein the test time point corresponding to the current value is different from the initial test time point;

a step S2 of generating a feature line according to the initial value, the current value, the initial test time point, and the test time point corresponding to the current value, and calculating a slope of the feature line;

a step S3 of determining whether the slope of the feature line is greater than or equal to a predetermined threshold and less than 0, a step S3a of returning to the step S1 to execute the steps S1 to S3 again if it is determined that the slope of the feature line is less than the predetermined threshold;

a step S4 of replacing the initial value with the current value, replacing the initial test time point with the test time point corresponding to the current value, and returning to the step S1 to execute the steps S1 to S3 again, if it is determined that the slope of the feature line is greater than or equal to 0; and a step S5 of terminating, if it is determined that the slope of the feature line is greater than or equal to the predetermined threshold and less than 0, the aging process applied to the light emitting device.

2. The aging test method of claim 1, wherein the step S2 comprises:

a step S21 of calculating a ratio of the current value to the initial value of the first characteristic parameter, defining the ratio as a current value of a second characteristic parameter, and setting an initial value of the second characteristic parameter to 1; and a step S22 of generating the feature line according to the current value and the initial value of the second characteristic parameter, the initial test time point, and the test time point corresponding to the current value.

3. The aging test method of claim 2, wherein the first characteristic parameter is brightness of the light emitting device, and the initial value is an initial brightness value of the light emitting device.

4. The aging test method of claim 2, further comprising a step of:
   setting a test mode of the aging test method before the step S0.

5. The aging test method of claim 1, after the step S5, further comprising:
   a step S6 of recording at least one of: duration of the aging process and an aging amount of the light emitting device.

6. The aging test method of claim 5, further comprising a step of:
   setting a test mode of the aging test method before the step S0.

7. The aging test method of claim 1, wherein the feature line is a curve or a straight line.

8. The aging test method of claim 1, further comprising a step of:
   storing respective values of the first characteristic parameter, test time points corresponding to the respective values, and the predetermined threshold in a memory.

9. The aging test method of claim 1, further comprising a step of:

setting a test mode of the aging test method before the step S0.

10. The aging test method of claim 9, wherein the test mode comprises one of: a constant-current mode, a constant-voltage mode and a constant-brightness mode.

11. The aging test method of claim 10, wherein a current density of the light emitting device is set to 10 mA/cm$^2$ in the constant-current mode.

12. A non-transitory computer readable storage medium, storing thereon with computer readable instructions, which cause implementation of the aging test method of claim 1 by a CPU when the computer readable instructions are executed by the CPU.

13. An aging test system for a light emitting device, comprising:
  a collection unit configured to collect, in an aging process applied to the light emitting device, an initial value of a first characteristic parameter of the light emitting device and an initial test time point corresponding to the initial value, and collect a current value of the first characteristic parameter and a test time point corresponding to the current value, wherein the test time point corresponding to the current value is different from the initial test time point;
  a generation unit configured to generate a feature line according to the initial value, the current value, the initial test time point and the test time point corresponding to the current value, and calculate a slope of the feature line;
  a determining unit configured to determine whether the slope of the feature line is greater than or equal to a predetermined threshold and less than 0, and trigger, when it is determined that the slope of the feature line is less than the predetermined threshold, the collection unit to continue to collect the current value of the first characteristic parameter and the test time point corresponding to the current value;
  a setting unit configured to replace, when it is determined by the determining unit that the slope of the feature line is greater than or equal to 0, the initial value with the current value, replace the initial test time point with the test time point corresponding to the current value, and trigger the collection unit to continue to collect the current value of the first characteristic parameter and the test time point corresponding to the current value; and
  an aging controller configured to terminate the aging process applied to the light emitting device when it is determined by the determining unit that the slope of the feature line is greater than or equal to the predetermined threshold and less than 0.

14. The aging test system of claim 13, wherein the generation unit comprises:
  a calculation subunit configured to calculate a ratio of the current value to the initial value of the first characteristic parameter, define the ratio as a current value of a second characteristic parameter, and set an initial value of the second characteristic parameter to 1; and
  a generation subunit configured to generate the feature line according to the current value and the initial value of the second characteristic parameter, the initial test time point and the test time point corresponding to the current value.

15. The aging test system of claim 14, wherein the first characteristic parameter is brightness of the light emitting device, and the initial value is an initial brightness value of the light emitting device.

16. The aging test system of claim 13, wherein the aging controller is further configured to record at least one of: duration of the aging process and an aging amount of the light emitting device after terminating the aging process applied to the light emitting device.

17. The aging test system of claim 13, wherein the setting unit is further configured to set a test mode for the aging test system before the collection unit begins to collect values of the first characteristic parameter.

18. The aging test system of claim 17, wherein the test mode comprises one of: a constant-current mode, a constant-voltage mode and a constant-brightness mode.

19. The aging test system of claim 18, wherein a current density of the light emitting device is set to 10 mA/cm$^2$ in the constant-current mode.

20. The aging test system of claim 13, further comprising a memory configured to store respective values of the first characteristic parameter, test time points corresponding to the respective values, and the predetermined threshold.

* * * * *